(12) United States Patent
Lee et al.

(10) Patent No.: US 11,502,192 B2
(45) Date of Patent: Nov. 15, 2022

(54) MONOLITHIC CHARGE COUPLED FIELD EFFECT RECTIFIER EMBEDDED IN A CHARGE COUPLED FIELD EFFECT TRANSISTOR

(71) Applicant: STMicroelectronics Pte Ltd, Singapore (SG)

(72) Inventors: Shin Phay Lee, Singapore (SG); Voon Cheng Ngwan, Singapore (SG); Maurizio Gabriele Castorina, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 60 days.

(21) Appl. No.: 17/217,689

(22) Filed: Mar. 30, 2021

(65) Prior Publication Data

US 2021/0336047 A1 Oct. 28, 2021

Related U.S. Application Data

(60) Provisional application No. 63/014,973, filed on Apr. 24, 2020.

(51) Int. Cl.
*H01L 29/78* (2006.01)
*H01L 29/10* (2006.01)
(Continued)

(52) U.S. Cl.
CPC ...... *H01L 29/7805* (2013.01); *H01L 27/0727* (2013.01); *H01L 27/2454* (2013.01);
(Continued)

(58) Field of Classification Search
CPC .......... H01L 29/7805; H01L 29/66136; H01L 29/7804; H01L 29/8613; H01L 29/0696;
(Continued)

(56) References Cited

U.S. PATENT DOCUMENTS

| 5,877,538 A | 3/1999 | Williams |
| 2016/0260709 A1* | 9/2016 | Rupp ................. H01L 27/0664 |
| 2019/0259873 A1* | 8/2019 | Yamanobe ........ H01L 29/41741 |

FOREIGN PATENT DOCUMENTS

DE 102010063314 A1 6/2012

OTHER PUBLICATIONS

EPO Search Report and Written Opinion for family-related EP Appl. No. 21169556.4, dated Sep. 13, 2021, 9 pages.

* cited by examiner

*Primary Examiner* — Joseph C. Nicely
(74) *Attorney, Agent, or Firm* — Crowe & Dunlevy (57) ABSTRACT

An integrated circuit includes a MOSFET device and a monolithic diode device, wherein the monolithic diode device is electrically connected in parallel with a body diode of the MOSFET device. The monolithic diode device is configured so that a forward voltage drop $Vf_{D2}$ of the monolithic diode device is less than a forward voltage drop $Vf_{D1}$ of the body diode of the MOSFET device. The forward voltage drop $Vf_{D2}$ is process tunable by controlling a gate oxide thickness, a channel length and body doping concentration level. The tunability of the forward voltage drop $Vf_{D2}$ advantageously permits design of the integrated circuit to suit a wide range of applications according to requirements of switching speed and efficiency.

26 Claims, 7 Drawing Sheets

(51) Int. Cl.
  *H01L 29/40*   (2006.01)
  *H01L 29/423*  (2006.01)
  *H01L 29/66*   (2006.01)
  *H01L 27/07*   (2006.01)
  *H01L 29/06*   (2006.01)
  *H01L 29/861*  (2006.01)
  *H01L 27/24*   (2006.01)

(52) U.S. Cl.
  CPC ...... *H01L 29/0696* (2013.01); *H01L 29/1095* (2013.01); *H01L 29/404* (2013.01); *H01L 29/407* (2013.01); *H01L 29/4236* (2013.01); *H01L 29/42364* (2013.01); *H01L 29/66136* (2013.01); *H01L 29/66712* (2013.01); *H01L 29/66734* (2013.01); *H01L 29/7803* (2013.01); *H01L 29/7804* (2013.01); *H01L 29/7813* (2013.01); *H01L 29/7827* (2013.01); *H01L 29/8613* (2013.01)

(58) Field of Classification Search
  CPC ............. H01L 29/1095; H01L 29/4236; H01L 29/66712; H01L 29/66734; H01L 29/7803; H01L 29/7813; H01L 29/7827; H01L 29/404; H01L 29/407; H01L 29/42364; H01L 27/0727; H01L 27/2454
  See application file for complete search history.

MONOLITHIC CHARGE COUPLED FIELD EFFECT RECTIFIER EMBEDDED IN A CHARGE COUPLED FIELD EFFECT TRANSISTOR

CROSS-REFERENCE TO RELATED APPLICATION

This application claims priority from U.S. Provisional Application for Patent No. 63/014,973 filed Apr. 24, 2020, the disclosure of which is incorporated by reference.

TECHNICAL FIELD

The present invention generally relates to monolithic integrated circuit devices and, in particular, to a monolithic integrated circuit field effect transistor device. More particularly, the invention concerns the integration of a monolithic charge coupled field effect rectifier device (for example, a diode) embedded in a charge coupled field effect transistor. A forward voltage drop of the charge coupled field effect rectifier device is process tunable to suit a wide range of applications according to requirements of switching speed and efficiency.

BACKGROUND

Figure 1:
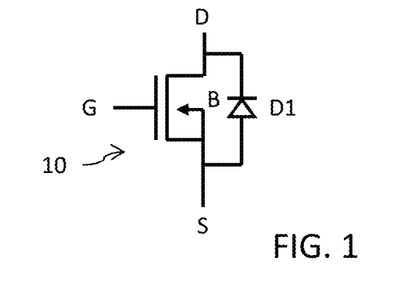
FIG. 1 is a circuit diagram of a power metal oxide semiconductor field effect transistor (MOSFET) device.

Reference is made to FIG. 1 showing a circuit diagram of a power metal oxide semiconductor field effect transistor (MOSFET) device 10. The power MOSFET 10 includes a gate G, a source S and a drain D. In this example, the power MOSFET 10 is an n-channel device, and thus the source S and drain D are formed by n-type doped semiconductor regions and the channel (and body B) is formed by a p-type doped semiconductor region. The body B is electrically tied to the source S. A body diode D1 of the MOSFET 10 is formed by a p-n junction with an anode formed by the p-type doped region of the body B and a cathode formed by the n-type region of the drain D.

In a switching circuit application, the body diode D1 is in reverse mode when the power MOSFET 10 is gate controlled to be conducting. When the power MOSFET 10 is subsequently turned off, the body diode D1, in its antiparallel circuit configuration, will be switched on in forward mode. The body diode D1 may, for example, have a forward voltage drop (Vf) of about 0.7V. This forward voltage drop, however, is too high to support industry demand for faster switching speeds and higher efficiency.

There is accordingly a need in the art to address the foregoing problem.

SUMMARY

In an embodiment, an integrated circuit comprises: a semiconductor layer doped with a dopant of a first-type with a MOSFET device and a diode device monolithically integrated in the semiconductor layer, wherein the diode device is electrically connected in parallel with a body diode of the MOSFET device. The MOSFET device comprises: a first trench in said semiconductor layer; a first region of the semiconductor layer doped with the dopant of the first-type at a top surface of the semiconductor layer; a third region of the semiconductor layer doped with a dopant of a second-type opposite the first-type and positioned between the first region and a first drift region formed by the semiconductor layer; and a first gate electrode located within the first trench and separated from the first region and third region by a first gate oxide layer having a first thickness. The diode device comprises: a second trench in said semiconductor layer; a second region of the semiconductor layer doped with the dopant of the first-type at the top surface of the semiconductor layer, wherein the first and second regions are separated from each other; a fourth region doped with the dopant of the second-type and positioned between the second region and a second drift region formed by the semiconductor layer; and a second gate electrode located within the second trench and separated from the second region and fourth region by a second gate oxide layer having a second thickness that is less than the first thickness.

In an embodiment, an integrated circuit comprises: a semiconductor layer doped with a dopant of a first-type with a MOSFET device and a diode device monolithically integrated in the semiconductor layer. The MOSFET device comprises: a drain region formed by the semiconductor layer; a body region within the semiconductor layer; a source region within the semiconductor layer; and a first insulated trench extending through the source region and body region and including a first gate. The diode device comprises: a cathode region formed by the semiconductor layer; an anode region within the semiconductor layer; and a second insulated trench extending through the anode region and including a second gate. A first metal layer is in electrical contact with the semiconductor layer to form a drain electrode for the MOSFET device and a cathode electrode for the diode device. A second metal layer is in electrical contact with the first gate to form a gate electrode for the MOSFET device. A third metal layer is in electrical contact with the source region to form a source electrode for the MOSFET device. A fourth metal layer is in electrical contact with the anode region and the second gate to form an anode electrode for the anode device.

BRIEF DESCRIPTION OF THE DRAWINGS

For a better understanding of the embodiments, reference will now be made by way of example only to the accompanying figures in which.

DETAILED DESCRIPTION

Figure 2:
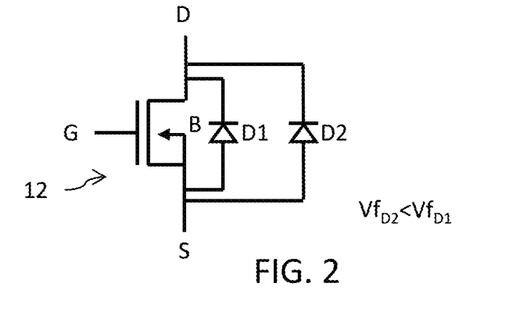
FIG. 2 is a circuit diagram of a power MOSFET device with an embedded rectifying diode.

Reference is made to FIG. 2 showing a circuit diagram of a power metal oxide semiconductor field effect transistor (MOSFET) device 12 with an embedded rectifying diode D2. The power MOSFET 12 includes a gate G, a source S and a drain D. In this example, the power MOSFET 12 is an n-channel device, and thus the source S and drain D are formed by n-type doped semiconductor regions and the channel (and body B) is formed by a p-type doped semiconductor region. The body B is electrically tied to the source S. A body diode D1 of the MOSFET 12 is formed by a p-n junction with an anode formed by the p-type doped region of the body B and a cathode formed by the n-type region of the drain D. An additional rectifying diode D2 is electrically coupled in parallel with body diode D1 between the body B (source S) and drain D. The rectifying diode D2 has a forward voltage drop $Vf_{D2}$ that is less than the forward voltage drop $Vf_{D1}$ of the body diode D1. As a result, there is an improvement in switching speed and efficiency with respect to the MOSFET 10 of FIG. 1. The value of the forward voltage drop $Vf_{D2}$ is process tunable in a manner described herein.

In a preferred implementation, the power MOSFET 12 is fabricated as a monolithic integrated circuit device with the rectifying diode D2 embedded in the structure of the field effect transistor having the body diode D1. In other words, the MOSFET 12 and diode D2 share a common semiconductor substrate. Furthermore, as will be described in more detail herein, the transistor and rectifying diode devices may share certain structures in common.

Figure 3A:
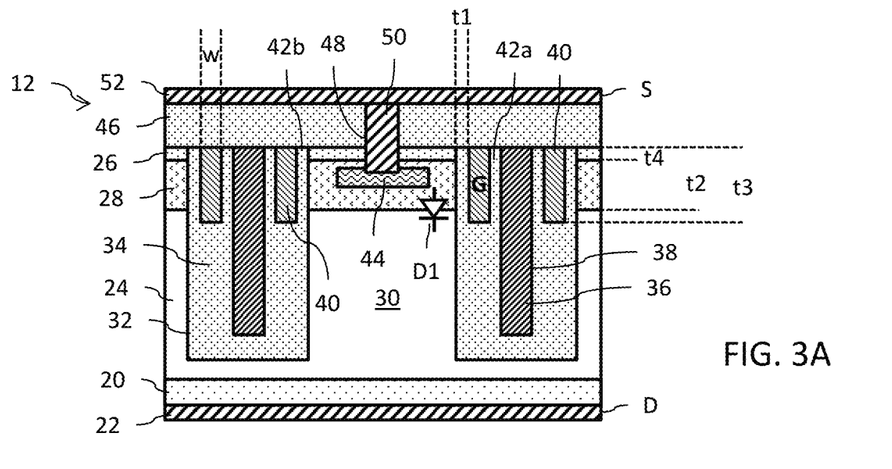
FIGS. 3A, 3B and 3C show parallel cross-sections of a power MOSFET fabricated as a vertical conduction transistor.

FIG. 3A shows a first cross-section of the power MOSFET 12 fabricated as a vertical conduction transistor. A semiconductor substrate 20 (for example, silicon) that is n-type doped includes a back surface. A first metal layer 22 at the back surface of the substrate 20 provides the drain electrode for the transistor 12. An n-type doped epitaxial layer 24, for example made of silicon, is formed from the upper surface of the substrate 20. The epitaxial layer 24 is more lightly doped than the semiconductor substrate 20 and forms an n-type drift region 30 for the drain of the transistor. A more heavily n-type doped region 26 at the front surface of the epitaxial layer 24 provides the source region of the transistor 12. The bottom of the n-type doped region 26 is spaced from the front surface of the epitaxial layer 24 to a depth t4 (where the depth t4 is about 0.2 µm, for example in a range of 0.15 µm to 0.25 µm). A p-type doped region 28 buried in the epitaxial layer 24, between the doped region for the source and the n-type drift region 30, provides the body region of the transistor 12. The bottom of the p-type doped region 28 is spaced from the front surface of the epitaxial layer 24 to a depth t2 (where the depth t2 is about 1 µm, for example in a range of 0.9 µm to 1.1 µm). Trenches 32 are formed in the epitaxial layer 24 on either side of the n-type drift region 30. The trenches 32 extend from the front surface of the epitaxial layer 24 completely through the regions 26 and 28 to a depth that is deeper than the bottom of the buried p-type doped region 28, but without reaching the top of the n-type doped substrate 20. The trenches are filled with an insulating material 34 (such as a dielectric material in the form of an oxide). A field plate electrode 36 is located within each trench 32. The field plate electrode 36 may, for example, be made of a polysilicon material deposited within a sub-trench 38 (formed in (or by) the insulation material 34) and insulated from the epitaxial layer 24 by the insulation material 34. A gate electrode 40 is also located within each trench 32 on opposite sides of the field plate electrode 36. Each gate electrode 40 may, for example, be made of a polysilicon material deposited within a sub-trench. The gate electrode 40 is insulated from the field plate electrode 36 by an interposed (i.e., inter-poly) oxide layer 42a. The gate electrode 40 is further insulated from the semiconductor regions 26, 28 and 30 (of the epitaxial layer 24) by a gate oxide layer 42b having a thickness t1 (where the thickness t1 is about 750 Å, for example in a range of 675 Å to 825 Å). The thicknesses of the inter-poly oxide layer 42a and the gate oxide layer 42b will typically be different, with the thickness t1 being thinner. The gate electrodes 40 extend from the front surface of the epitaxial layer 24 to a depth t3 (where depth t3 is greater than depth t2; where the depth t3 is about 1.3 µm, for example in a range of 1.2 µm to 1.4 µm) and have a width w in the plane of the cross-section (where the width w is about 0.45 µm, for example in a range of 0.4 µm to 0.5 µm). A more heavily p-type doped region 44 is buried within the buried p-type doped region 28 at a position between two adjacent trenches 32 to provide a contact to the p-type doped region 28. An insulating layer 46 extends over the top surface of the epitaxial layer 24 (it will be noted that the layer 46 may be fabricated of a stack of insulating layers). A first opening 48 extends through the insulating layer 46 at a position aligned with the more heavily p-type doped region 44. The first opening 48 further extends through the more heavily n-type doped region 26 at the front surface of the epitaxial layer (and may, depending on the location of the heavily p-type doped region 44, further extend partially through the p-type doped region 28 for the body of the transistor). The first opening 48 is filled with a metal material forming a portion 50 of the source S electrode of the transistor. It will be noted that the metal material of portion 50 is in physical and electrical contact directly with both the more heavily n-type doped region 26 forming the source region and the heavily p-type doped region 44 forming the contact to the p-type doped region 28 for the body of the transistor. A second metal layer 52 at the top surface of the insulating layer 46 provides a further portion of the source S electrode for the transistor.

Figure 7A:
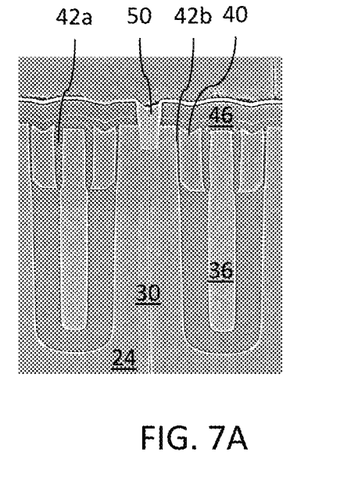
FIG. 7A shows a TEM image of the FIG. 3A cross-section.

A TEM image of the FIG. 3A cross-section is shown in FIG. 7A.

Figure 3B:
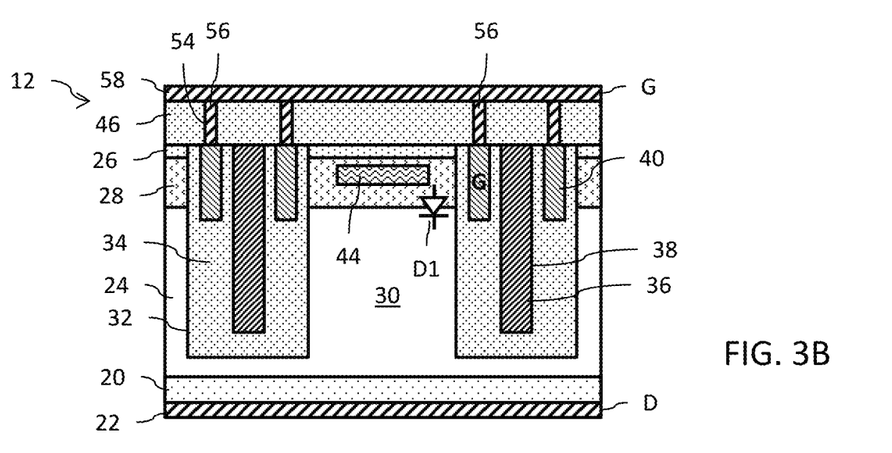

FIG. 3B shows a second cross-section of the power MOSFET 12. The second cross-section of FIG. 3B is made in a plane parallel to, but offset from, the plane of the first cross-section of FIG. 3A. Like reference numbers refer to same component parts. The offset between the cross-sections of FIGS. 3A and 3B is in the direction orthogonal to the parallel planes of those cross-sections (i.e., in a direction into/out of the page of the drawing illustration). A second opening 54 extends through the insulating layer 46 at a position aligned with each gate electrode 40. The second opening 54 is filled with a metal material forming a portion 56 of the gate electrode of the transistor. It will be noted that the metal of portion 56 is in electrical contact with the polysilicon material of the gate electrode 40. A third metal layer 58 at the top surface of the insulating layer 46 provides a further portion of the gate G electrode for the transistor.

Figure 3C:
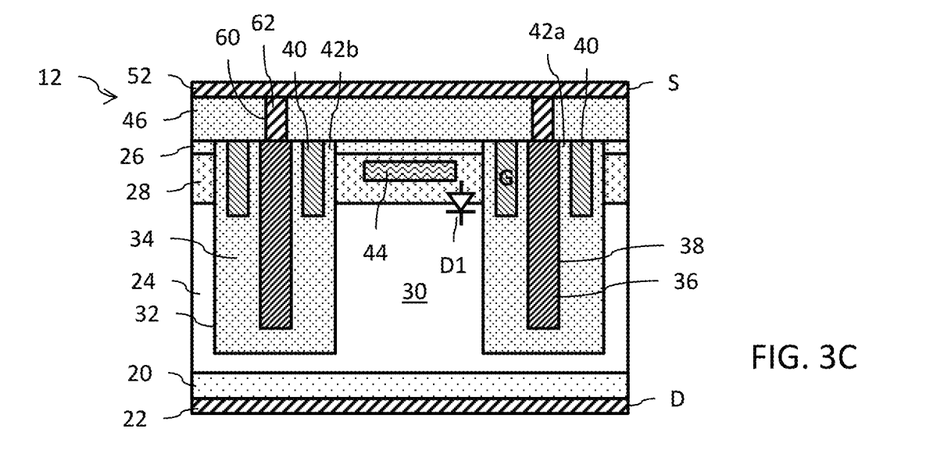

FIG. 3C shows a third cross-section of the power MOSFET 12. The third cross-section of FIG. 3C is made in a plane parallel to, but offset from, the planes of the first and second cross-sections of FIGS. 3A and 3B, respectively. Like reference numbers refer to same component parts. The offsets between the cross-sections of FIGS. 3A, 3B and 3C is in the direction orthogonal to the parallel planes of those cross-sections (i.e., in a direction into/out of the page of the drawing illustration). A third opening 60 extends through the insulating layer 46 at a position aligned with each field plate electrode 36. The third opening 60 is filled with a metal material forming a further portion 62 of the source S electrode of the transistor. It will be noted that the metal of portion 62 is in electrical contact with the polysilicon material of the field plate electrode 36. The second metal layer 52 at the top surface of the insulating layer 46 provides a further portion of the source S electrode for the transistor.

Figure 4A:
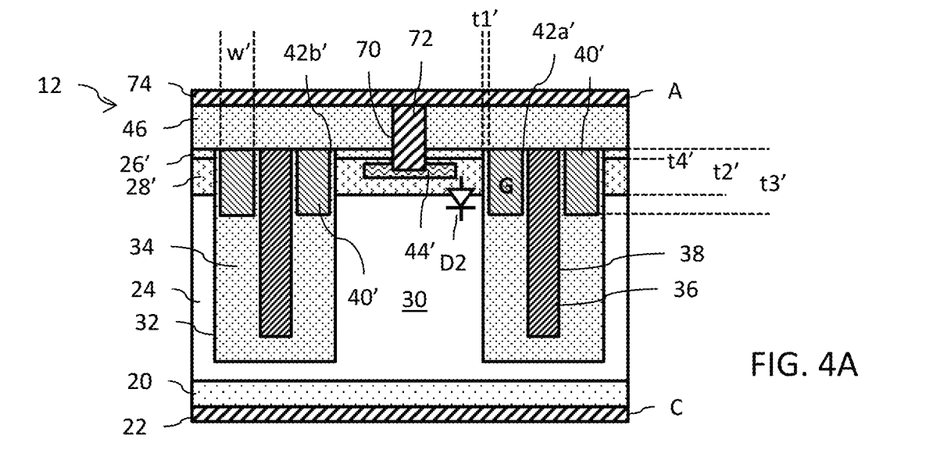
FIGS. 4A, 4B and 4C show parallel cross-sections of a rectifying diode embedded with the power MOSFET of FIGS. 3A-3C.

FIG. 4A shows a first cross-section of a monolithic rectifying diode which is embedded with the power MOSFET 12 of FIGS. 3A-3C. Like reference numbers refer to same component parts. The structure of the rectifying diode may share in common with the structure of the power MOSFET 12 the following parts: substrate 20 (here forming a cathode region of the diode D2), first metal layer 22 (here providing the cathode electrode), lightly doped epitaxial layer 24 with n-type drift region 30, trenches 32, insulation material 34, field plate electrode 36, sub-trench 38, and insulating layer 46. A more heavily n-type doped region 26' at the front surface of the epitaxial layer 24 provides a source region. The bottom of the n-type doped region 26' is spaced from the front surface of the epitaxial layer 24 to a depth t4' (where the depth t4' is about 0.15 µm, for example in a range of 0.1 µm to 0.2 µm). A p-type doped region 28' buried in the epitaxial layer 24, between the doped region for the source and the n-type drift region 30, provides a body region. The doping concentration level of the p-type dopant for region 28' is selected in connection with tuning the forward voltage drop $Vf_{D2}$ of the diode D2. The bottom of the p-type doped region 28' is spaced from the front surface of the epitaxial layer 24 to a depth t2' (where the depth t2' is less than the depth t2; where the depth t2' is about 0.6 µm, for example in a range of 0.5 µm to 0.7 µm). The depth t2' of the p-type doped region 28', which defines the channel length, is selected in connection with tuning the forward voltage drop $Vf_{D2}$ of the diode D2. The trenches 32 extend completely through regions 26' and 28' and terminate within the epitaxial layer 24. A gate electrode 40' is also located within each trench 32 on opposite sides of the field plate electrode 36. Each gate electrode 40' may, for example, be made of a polysilicon material. The gate electrode 40' is insulated from the field plate electrode 36 by an interposed (i.e., inter-poly) oxide layer 42a'. The gate electrode is further insulated from the semiconductor regions 26', 28' and 30 (of the epitaxial layer 24) by a gate oxide layer 42b' having a thickness t1' (where the thickness t1' is less than the thickness t1; where the thickness t1' is about 50 Å, for example in a range of 40 Å to 60 Å). The thickness t1 'of the gate oxide layer 42b' is selected in connection with tuning the forward voltage drop $Vf_{D2}$ of the diode D2. The gate electrodes 40' extend from the front surface of the epitaxial layer 24 to a depth t3' (where the depth t3' is greater than depth t2', and wherein the depth t3' is less than the depth t3; where the depth t3' is about 0.9 µm, for example in a range of 0.8 µm to 1.0 µm) and have a width w' in the plane of the cross-section (where the width w is less than the width w'; where the width w' is about 0.6 µm, for example in a range of 0.55 µm to 0.65 µm). A more heavily p-type doped region 44' is buried within the buried p-type doped region 28' at a position between two adjacent trenches 32 to provide a contact for the body region. A fourth opening 70 extends through the insulating layer 46 at a position aligned with the more heavily p-type doped region 44'. The fourth opening 70 further extends through the more heavily n-type doped region 26' at the front surface of the epitaxial layer (and may, depending on the location of the heavily p-type doped region 44', further extend partially through the p-type doped region 28' for the body of the transistor). The fourth opening 70 is filled with a metal material forming a portion 72 of the anode A electrode of the rectifying diode D2. It will be noted that the metal material of portion 72 is in physical and electrical contact directly with both the more heavily n-type doped region 26' forming the source region and the heavily p-type doped region 44' forming the contact to the p-type doped region 28' for the body. A fourth metal layer 74 at the top surface of the insulating layer 46 provides a further portion of the anode A electrode. The fourth metal layer 74 is electrically connected (shorted) to the second metal layer 52 (and in an embodiment, the layers 52 and 74 may comprise a same metal layer). It will be noted that the metal layer 22 is also present and forms a portion of the cathode C electrode.

Figure 7B:
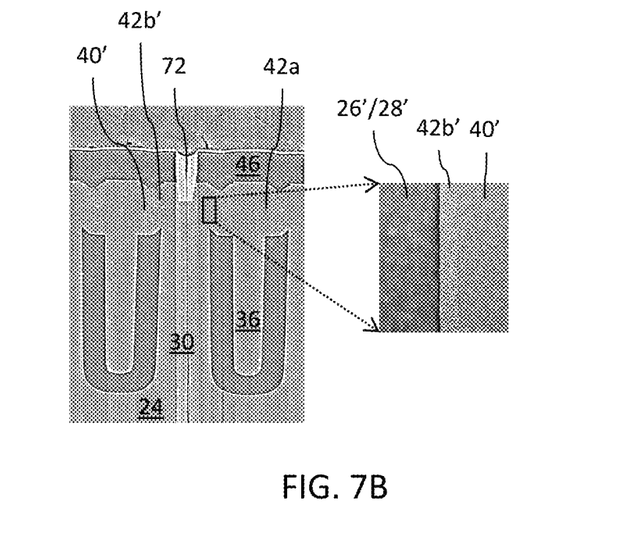
FIG. 7B shows a TEM image of the FIG. 4A cross-section.

A TEM image of the FIG. 4A cross-section is shown in FIG. 7B.

In an embodiment, the first cross-section of FIG. 4A is made in a plane parallel to, but offset from, the planes of the first, second and third cross-sections of FIGS. 3A, 3B and 3C for the power MOSFET 12. The offsets between the cross-sections of FIGS. 3A, 3B, 3C and 4A is in the direction orthogonal to the parallel planes of those cross-sections (i.e., in a direction into/out of the page of the drawing illustration).

Figure 4B:
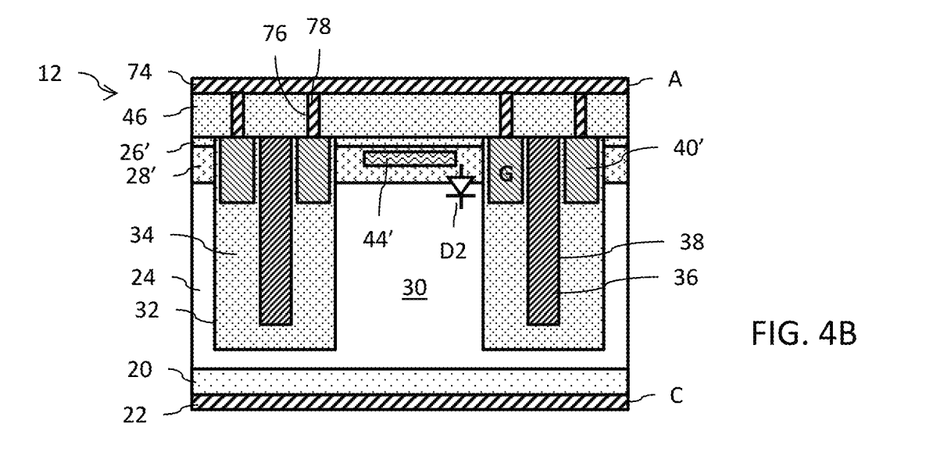

FIG. 4B shows a second cross-section of the rectifying diode. The second cross-section of FIG. 4B is made in a plane parallel to, but offset from, the plane of the first cross-section of FIG. 4A. Like reference numbers refer to same component parts. The offset between the cross-sections of FIGS. 4A and 4B is in the direction orthogonal to the parallel planes of those cross-sections (i.e., in a direction into/out of the page of the drawing illustration). A fifth opening 76 extends through the insulating layer 46 at a position aligned with each gate electrode 40'. The fifth opening 76 is filled with a metal material forming a portion 78 of the anode electrode. It will be noted that the metal of portion 78 is in electrical contact with the polysilicon material of the gate electrode 40'. The fourth metal layer 74 at the top surface of the insulating layer 46 provides a further portion of the anode A electrode.

Figure 4C:
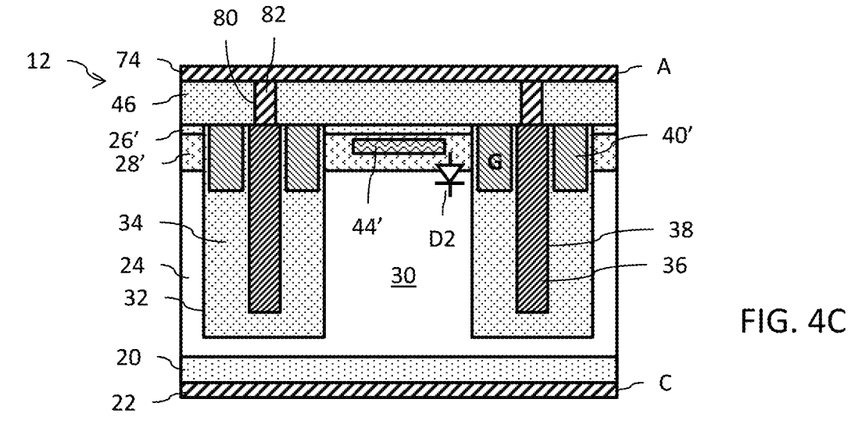

FIG. 4C shows a third cross-section of the rectifying diode. The third cross-section of FIG. 4C is made in a plane parallel to, but offset from, the planes of the first and second cross-sections of FIGS. 4A and 4B, respectively. Like reference numbers refer to same component parts. The offsets between the cross-sections of FIGS. 4A, 4B and 4C is in the direction orthogonal to the parallel planes of those cross-sections (i.e., in a direction into/out of the page of the drawing illustration). A sixth opening 80 extends through the insulating layer 46 at a position aligned with each field plate electrode 36. The sixth opening 80 is filled with a metal material forming a portion 82 of the anode A electrode. It will be noted that the metal of portion 82 is in electrical contact with the polysilicon material of the field plate electrode 36. The fourth metal layer 74 at the top surface of the insulating layer 46 provides a further portion of the anode A electrode.

Figure 5:
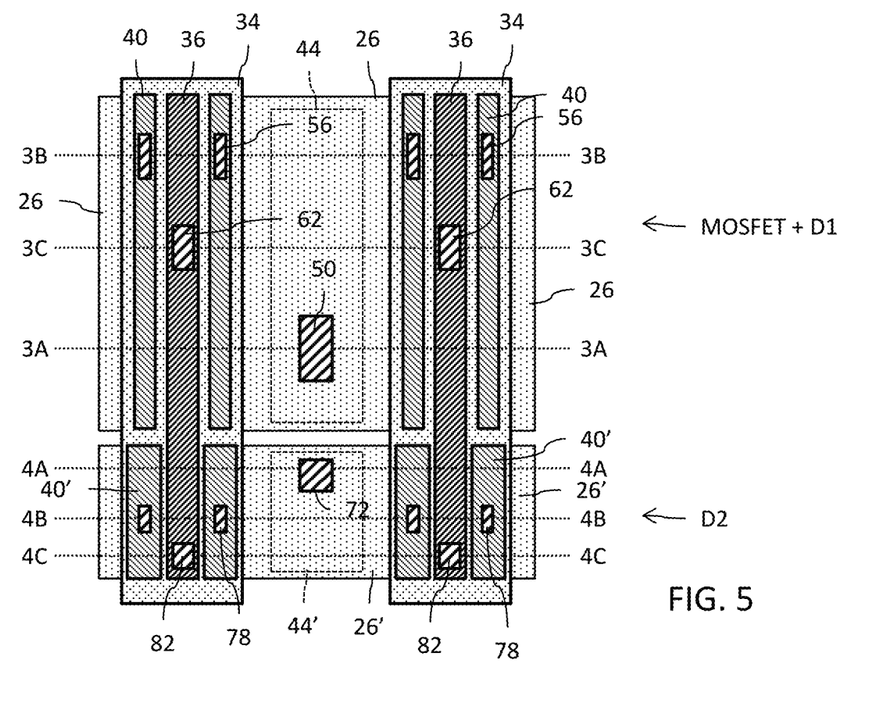
FIG. 5 shows a top (plan) view of a layout for the monolithic integrated circuit of the power MOSFET device with the embedded rectifying diode.

Reference is now made to FIG. 5 which shows a top (plan) view of a layout for the monolithic integrated circuit of the power metal oxide semiconductor field effect transistor (MOSFET) device 12 with an embedded rectifying diode D2. The plan view is illustrated at a level of the upper surface of the epitaxial layer 24 corresponding to the regions 26 and 26'. The relative position of regions 44 and 44' is shown by dotted lines as these regions are buried below the regions 26 and 26'. Regions 28 and 28' are not shown, but generally have a same plan layout as the regions 26 and 26'. The electrode portions 50, 56, 62, 72, 78, and 82 are shown, it being understood that the number of included portions and their positions is shown by way of example only and that in embodiments there will likely be a plurality of each portion provided. Furthermore, the illustration of just a pair of trenches is by way of example only and in a preferred implementation the layout of will include a plurality of pairs of trenches arranged parallel to each other (for example, to the left and right of the pair shown in the illustration). In this example, the trench 32 and its field plate electrode 36 are shared structures between the MOSFET 12 at the top and the diode D2 at the bottom. In an alternative implementation, the MOSFET 12 and diode D2 may instead have separate trench 32 and field plate electrode 36 structures.

Figure 6:
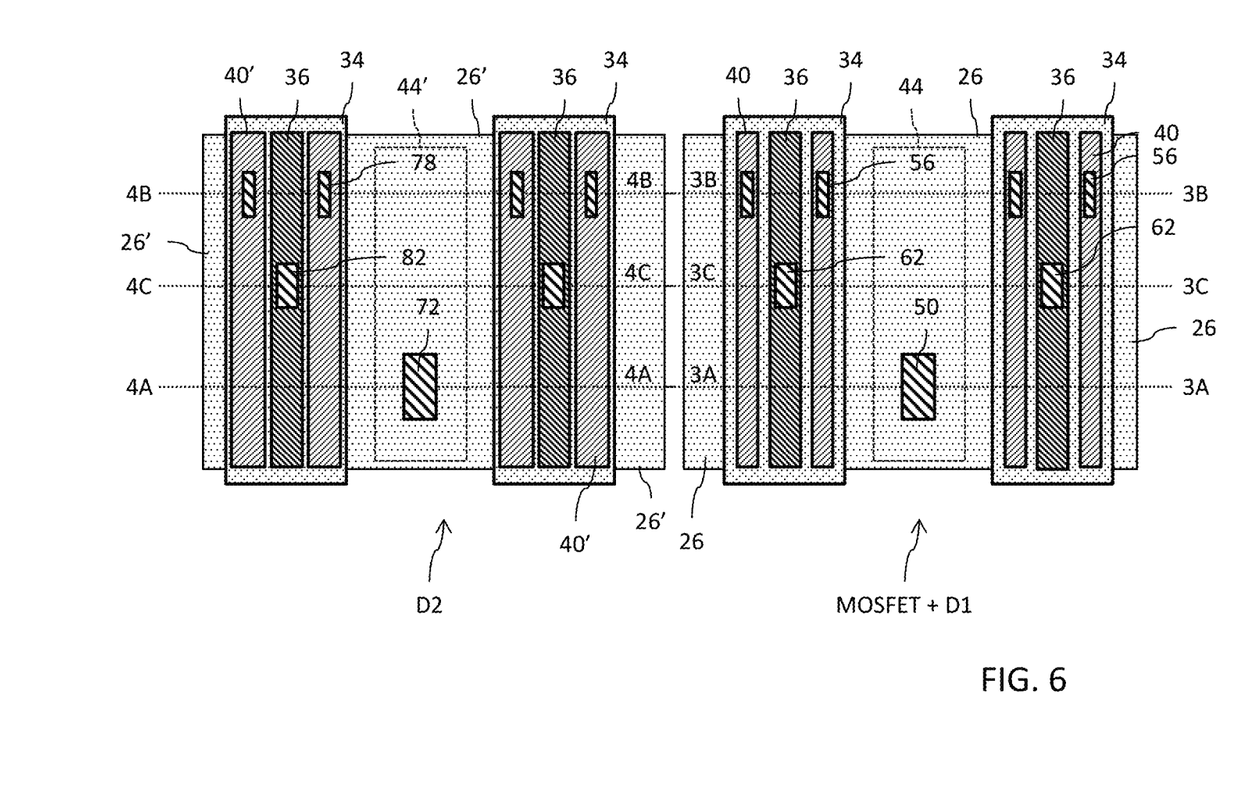
FIG. 6 shows a top (plan) view of a layout for the monolithic integrated circuit of the power MOSFET device with the embedded rectifying diode.

Reference is now made to FIG. 6 which shows a top (plan) view of a layout for the monolithic integrated circuit of the power metal oxide semiconductor field effect transistor (MOSFET) device 12 with an embedded rectifying diode. The plan view is illustrated at a level of the upper surface of the epitaxial layer 24 corresponding to the regions 26 and 26'. In this layout the structures for the MOSFET device 12 with the embedded rectifying diode D2 are arranged side-by-side (as opposed to the aligned layout as shown in FIG. 5). It will be understood that the layout for the embedded rectifying diode D2 as shown on the left of the layout for the MOSFET device 12 in FIG. 6 could be replicated on the right of the layout for the MOSFET device 12. Additionally, as noted above in connection with the layout of FIG. 5, the illustration of just a pair of trenches is by way of example only and in a preferred implementation the layout of each of the MOSFET device 12 and the embedded rectifying diode D2 will include a plurality of pairs of trenches.

The plan views of FIGS. 5-6 are examples only of layout configurations. The illustrations are not drawn to scale. Furthermore, the illustrations do not show the layout for a complete monolithic device. The layout structures as illustrated may be replicated a plurality of times and arranged in a tiled or cell manner as is well-known to those skilled in the art.

FIG. 8A-8H show process steps for the fabrication of the gates 40, 40' and gate oxide layers 42, 42' for the MOSFET device 12 with the embedded rectifying diode D2. It will be noted that the left side in each of FIGS. 8A-8H shows a location where the MOSFET device 12 (with D1) is being fabricated and the right side in each of FIGS. 8A-8H shows a location where the embedded rectifying diode D2 is being fabricated. The steps of FIGS. 8A-8H are illustrative only and do not show all structures or all individual process steps. The drawings are not presented to scale.

Figure 8A:
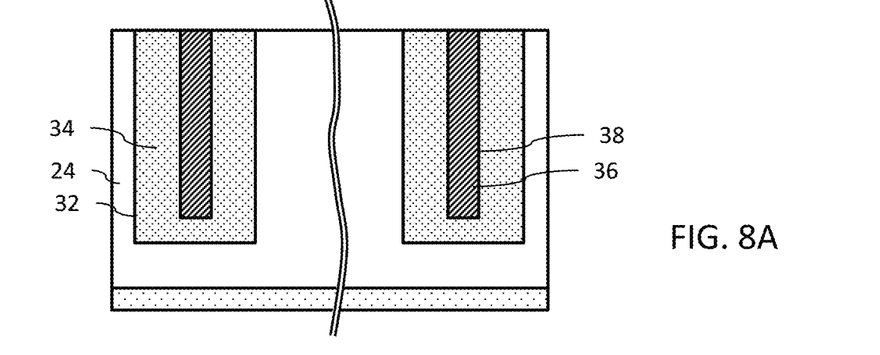
FIGS. 8A-8H show process steps for fabrication of a monolithic semiconductor integrated circuit device.

In FIG. 8A, standard fabrication processes well known to those skilled in the art have already been performed to produce the trenches 32, insulating material 34, sub-trenches 38 and field plate electrodes 36. As an example of such a process: the trenches 32 are produced in the epitaxial layer 24 by an etch process; a conformal insulating material layer is deposited to line each trench and define the sub-trench 38; a polysilicon material is then deposited to fill each sub-trench; a polishing operation is performed to remove excess polysilicon material and define the field plate electrode 36.

Figure 8B:
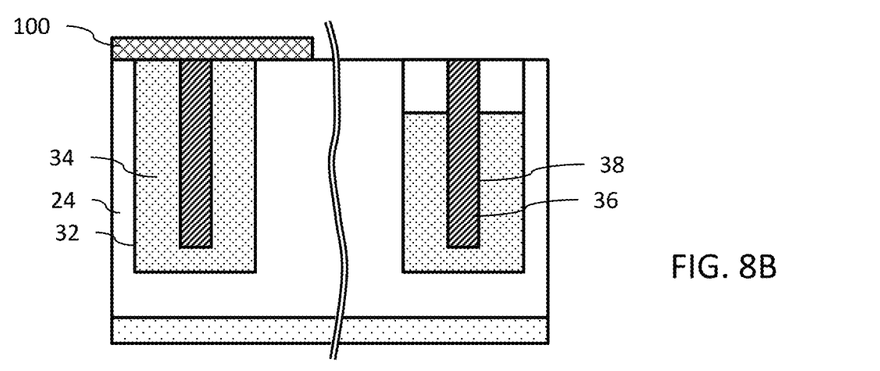

In FIG. 8B, a mask 100 is provided over the location where the MOSFET device 12 is being fabricated. An etch is then performed to remove a portion of the insulating material 34 at an upper part of the trench in location where the embedded rectifying diode D2 is being fabricated. The etch here is performed to the depth t3'.

Figure 8C:
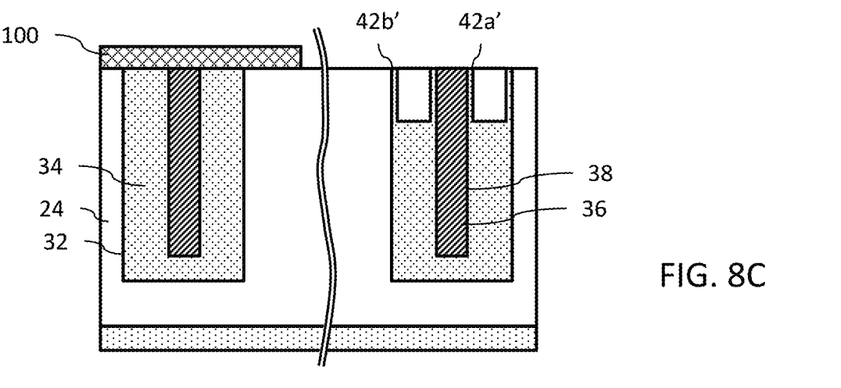

In FIG. 8C, a thermal oxidation is performed to grow the gate oxide 42b' with a thickness t1' on the surface of the epitaxial layer 24 (at regions 26', 28' and 30) which is exposed as a result of the etch in FIG. 8B. By controlling the parameters of the thermal oxidation, the thickness t1' can be selected in connection with tuning the forward voltage drop $Vf_{D2}$ of the diode D2. It will be noted that this thermal oxidation step will further produce the inter-poly oxide layer 42a'.

Figure 8D:
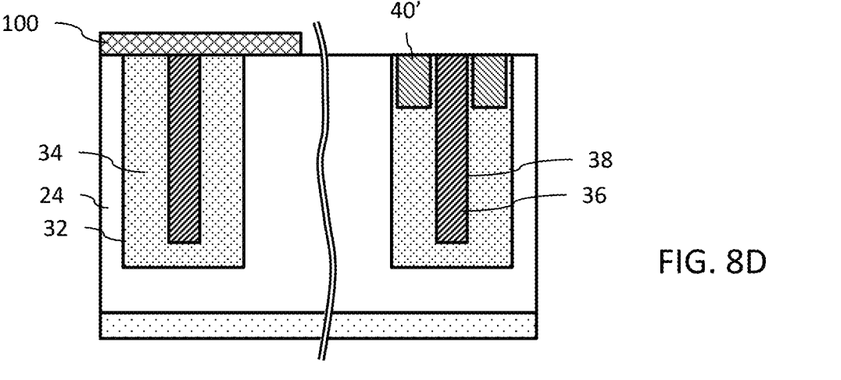

In FIG. 8D, polysilicon material is deposited to fill the opening and form the gate 40'.

Figure 8E:
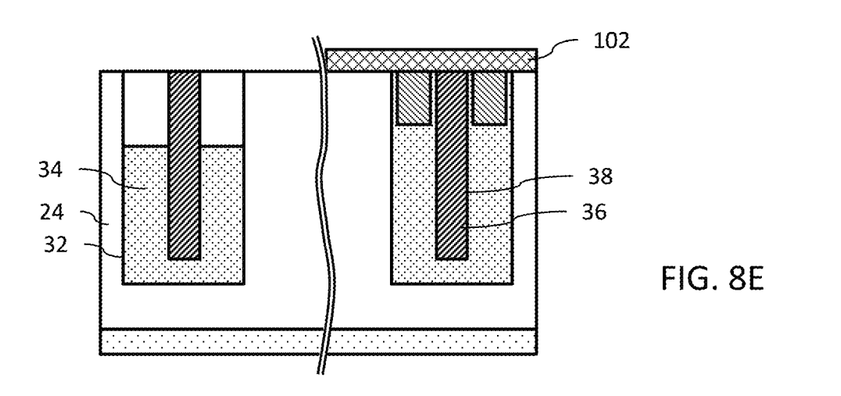

In FIG. 8E, a mask 102 is provided over the location where the embedded rectifying diode D2 is being fabricated. An etch is then performed to remove a portion of the insulating material 34 at an upper part of the trench in location where the MOSFET device 12 is being fabricated. The etch here is performed to the depth t3.

Figure 8F:
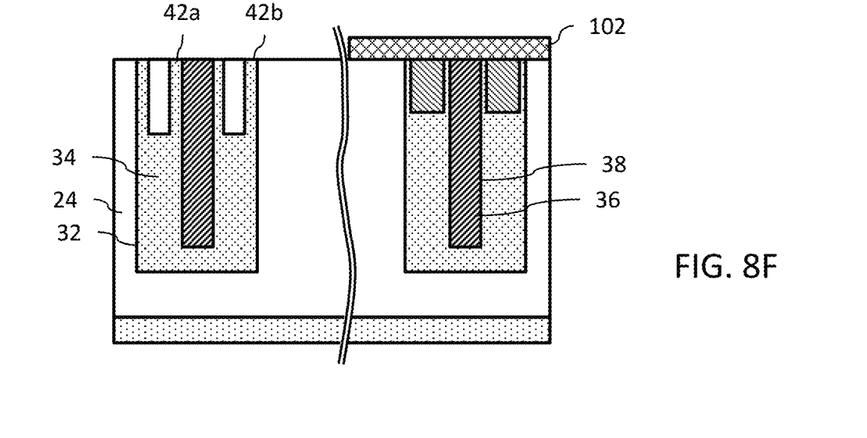

In FIG. 8F, a thermal oxidation is performed to grow the gate oxide 42b with a thickness t1 on the surface of the epitaxial layer 24 (at regions 26, 28 and 30) which is exposed as a result of the etch in FIG. 8E. It will be noted that this thermal oxidation step will further produce the inter-poly oxide layer 42a.

Figure 8G:
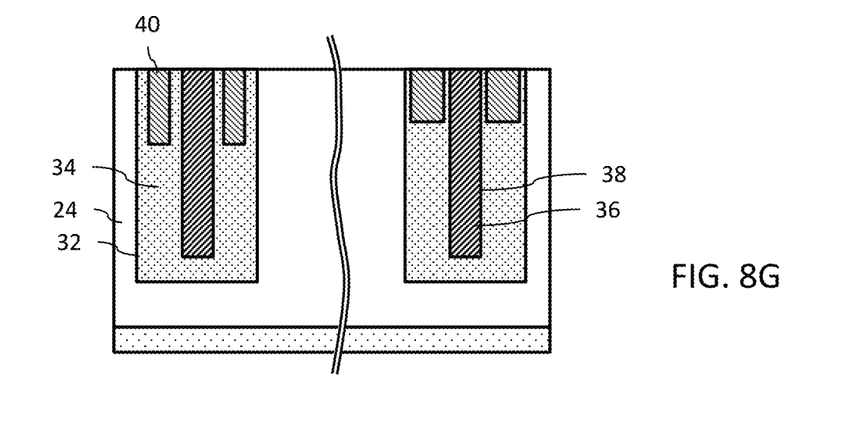

In FIG. 8G, polysilicon material is deposited to fill the opening and form the gate 40.

Figure 8H:
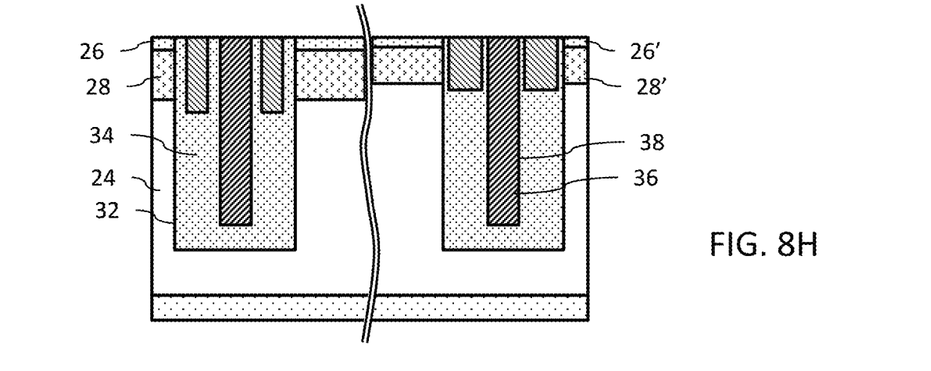

The fabrication process continues with the use of well-known masking and dopant implantation steps to form the regions 26 and 28 for the transistor 12 (left side) and the regions 26' and 28' for the rectifying diode D2 (right side). The result is shown in FIG. 8H. By controlling the parameters of the implantation process, the thickness t2' and the dopant concentration in region 28' can be selected in connection with tuning the forward voltage drop $Vf_{D2}$ of the diode D2.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit, comprising:
   a semiconductor layer doped with a dopant of a first-type;
   a MOSFET device, comprising:
      a first trench in said semiconductor layer;
      a first region of the semiconductor layer doped with the dopant of the first-type at a top surface of the semiconductor layer;
      a third region of the semiconductor layer doped with a dopant of a second-type opposite the first-type and positioned between the first region and a first drift region formed by the semiconductor layer; and
      a first gate located within the first trench and separated from the first region and third region by a first gate oxide layer having a first thickness;
   a diode device, comprising:
      a second trench in said semiconductor layer;
      a second region of the semiconductor layer doped with the dopant of the first-type at the top surface of the semiconductor layer, wherein the first and second regions are separated from each other;
      a fourth region doped with the dopant of the second-type and positioned between the second region and a second drift region formed by the semiconductor layer; and
      a second gate located within the second trench and separated from the second region and fourth region by a second gate oxide layer having a second thickness that is less than the first thickness;

wherein the diode device is electrically connected in parallel with a body diode of the MOSFET device.

2. The integrated circuit of claim 1, wherein said first trench and said second trench are a same trench.

3. The integrated circuit of claim 1, wherein said first trench and said second trench are different trenches.

4. The integrated circuit of claim 1, wherein the semiconductor layer is an epitaxial layer supported by a semiconductor substrate.

5. The integrated circuit of claim 1:
wherein the MOSFET device further comprises a first field plate located within the first trench and separated from the first gate by a first interposed oxide layer; and
wherein the diode device further comprises a second field plate located within the second trench and separated from the second gate by a second interposed oxide layer.

6. The integrated circuit of claim 5:
wherein the MOSFET device further comprises a source electrode that is electrically connected to the first region and to the first field plate;
wherein the diode device further comprises an anode electrode that is electrically connected to the second region and to the second field plate; and
wherein the source electrode and anode electrode are electrically connected to each other.

7. The integrated circuit of claim 6, further comprising:
a gate electrode for the MOSFET device that is electrically connected to the first gate; and
wherein the anode electrode is further electrically connected to second gate.

8. The integrated circuit of claim 1, wherein the MOSFET device further comprises:
a fifth region within the third region, said fifth region being more heavily doped with the dopant of the second-type than the third region;
a source electrode that is electrically connected to the first region and to the fifth region.

9. The integrated circuit of claim 1, wherein the diode device comprises:
a sixth region within the fourth region, said sixth region being more heavily doped with the dopant of the second-type than the fourth region; and
an anode electrode that is electrically connected to the second region and to the sixth doped region.

10. The integrated circuit of claim 9, wherein the anode electrode is further electrically connected to the second gate.

11. The integrated circuit of claim 1, wherein a forward voltage drop of the diode device is less than a forward voltage drop of the body diode of the MOSFET device.

12. The integrated circuit of claim 1, further comprising:
a drain electrode of the MOSFET device that is electrically connected to the semiconductor layer; and
a cathode electrode of the diode device that is electrically connected to the semiconductor layer.

13. The integrated circuit of claim 12, wherein the semiconductor layer is an epitaxial layer supported by a semiconductor substrate, and wherein the drain electrode and cathode electrode are located at a back surface of the semiconductor substrate.

14. The integrated circuit of claim 1, wherein a thickness of the first region is greater than a thickness of the second region.

15. The integrated circuit of claim 1, wherein a depth of a bottom of the third region is greater than a depth of a bottom of the fourth region.

16. The integrated circuit of claim 1, wherein a width of the first gate is less than a width of the second gate.

17. The integrated circuit of claim 1, wherein a depth of the first gate is greater than a depth of the second gate.

18. The integrated circuit of claim 1, wherein the second thickness and a depth and doping level of the fourth region are process tuned to set a forward voltage drop of the diode device to be less than a forward voltage drop of the body diode of the MOSFET device.

19. An integrated circuit, comprising:
a semiconductor layer doped with a dopant of a first-type;
a MOSFET device, comprising:
a drain region formed by the semiconductor layer;
a body region within the semiconductor layer;
a source region within the semiconductor layer; and
a first insulated trench extending through the source region and body region and including a first gate;
a diode device, comprising:
a cathode region formed by the semiconductor layer;
an anode region within the semiconductor layer; and
a second insulated trench extending through the anode region and including a second gate;
a first metal layer in electrical contact with the semiconductor layer to form a drain electrode for the MOSFET device and a cathode electrode for the diode device;
a second metal layer in electrical contact with the first gate to form a gate electrode for the MOSFET device;
a third metal layer in electrical contact with the source region to form a source electrode for the MOSFET device; and
a fourth metal layer in electrical contact with the anode region and the second gate to form an anode electrode for the anode device.

20. The integrated circuit of claim 19, wherein the third and fourth metal layers are electrically connected so that the diode device is electrically connection in parallel with a body diode of the MOSFET device.

21. The integrated circuit of claim 20, wherein a forward voltage drop of the diode device is less than a forward voltage drop of the body diode of the MOSFET device.

22. The integrated circuit of claim 19, wherein said first insulated trench and said second insulated trench are a same insulated trench.

23. The integrated circuit of claim 19, wherein said first insulated trench and said second insulated trench are different insulated trenches.

24. The integrated circuit of claim 19, wherein the first gate of the first insulated trench is separated from the source and body regions by a first gate oxide layer having a first thickness, and wherein the second gate of the second insulated trench is separated from the anode region by a second gate oxide layer having a second thickness that is less than the first thickness.

25. The integrated circuit of claim 24:
wherein the MOSFET device further comprises a first field plate located within the first insulated trench and separated from the first gate by a first interposed oxide layer; and
wherein the diode device further comprises a second field plate located within the second insulated trench and separated from the second gate by a second interposed oxide layer.

26. The insulated circuit of claim 25:
wherein the third metal layer is further in electrical contact with the first field plate; and wherein the fourth metal layer is further in electrical contact with the second field plate.

* * * * *